United States Patent
Narasimhan et al.

(10) Patent No.: US 9,607,674 B1
(45) Date of Patent: Mar. 28, 2017

(54) PULSE LATCH RESET TRACKING AT HIGH DIFFERENTIAL VOLTAGE

(71) Applicant: QUALCOMM Incorporated, San Diego, CA (US)

(72) Inventors: Mukund Narasimhan, Bangalore (IN); Sharad Kumar Gupta, Bangalore (IN); Veerabhadra Rao Boda, East Godavari (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/989,750

(22) Filed: Jan. 6, 2016

(51) Int. Cl.
G11C 7/00 (2006.01)
G11C 7/22 (2006.01)
G11C 7/10 (2006.01)

(52) U.S. Cl.
CPC ............ G11C 7/222 (2013.01); G11C 7/10 (2013.01)

(58) Field of Classification Search
CPC ................................ G11C 7/222; G11C 7/10
USPC ............................ 365/191, 193, 194, 189.05
See application file for complete search history.

(56) References Cited

U.S. PATENT DOCUMENTS

| | | | |
|---|---|---|---|
| 5,442,915 A * | 8/1995 | Komatsu ............... | B60T 13/565 60/547.1 |
| 5,448,715 A * | 9/1995 | Lelm ................... | G06F 13/1689 713/600 |
| 6,327,667 B1 * | 12/2001 | Hetherington ...... | G06F 12/0844 711/E12.044 |
| 6,366,991 B1 * | 4/2002 | Manning ............. | G06F 1/12 711/167 |
| 6,975,154 B1 * | 12/2005 | Pedersen .................. | G06F 1/10 327/293 |
| 7,180,353 B2 * | 2/2007 | Chiu ....................... | G06F 1/32 327/295 |
| 7,418,616 B2 * | 8/2008 | Helzer ................. | G11C 7/1051 713/401 |
| 7,545,896 B2 * | 6/2009 | Hutson .................... | H04L 7/02 327/144 |
| 8,058,900 B1 * | 11/2011 | Rosen ................. | H03K 19/096 326/28 |
| 8,192,829 B2 * | 6/2012 | Sturley .................... | E01O 5/22 428/156 |
| 8,255,702 B1 * | 8/2012 | Pedersen ............... | G06F 21/76 713/189 |
| 8,638,153 B2 | 1/2014 | Ge et al. | |
| 8,680,901 B2 | 3/2014 | Shrivastava et al. | |
| 8,724,421 B2 | 5/2014 | Evans et al. | |
| 8,823,209 B2 * | 9/2014 | Tatsumi ................ | G06F 1/3203 307/39 |

(Continued)

*Primary Examiner* — Viet Q Nguyen
(74) *Attorney, Agent, or Firm* — Arent Fox LLP

(57) ABSTRACT

A method and an apparatus for generating an internal memory clock are provided. The apparatus includes a pulse generator configured to receive a first clock signal in a first power domain and initiate a second clock signal in a second power domain in response to the first clock signal. The first power domain provides a first voltage for logic operations and the second power domain provides a second voltage for memory operations. The apparatus includes a tracking circuit configured to generate a reset signal based on a voltage level of the first power domain. The reset signal may be configured to reset the pulse generator in the first power domain. The apparatus may further include a latch configured to receive the second clock signal in the second power domain.

27 Claims, 8 Drawing Sheets

(56) References Cited

U.S. PATENT DOCUMENTS

| | | | | |
|---|---|---|---|---|
| 8,890,594 B1* | 11/2014 | Tadi | ............... | H03K 3/0375 |
| | | | | 327/117 |
| 8,913,457 B2 | 12/2014 | Kohli et al. | | |
| 8,937,492 B1* | 1/2015 | Gideon | ............ | H03K 19/003 |
| | | | | 326/93 |
| 8,994,402 B2* | 3/2015 | Hwang | ............ | 326/80 |
| 9,117,615 B2* | 8/2015 | Salonga | ............ | H01H 85/08 |
| 2003/0043943 A1* | 3/2003 | Chang | ............ | H04L 7/02 |
| | | | | 375/354 |
| 2005/0036577 A1* | 2/2005 | Sweet | ............ | H04N 5/46 |
| | | | | 375/354 |
| 2011/0235459 A1* | 9/2011 | Ware | ............ | G11C 7/04 |
| | | | | 365/233.11 |
| 2011/0241741 A1* | 10/2011 | Millendorf | ............ | G06F 1/24 |
| | | | | 327/143 |
| 2012/0124423 A1* | 5/2012 | Chakravadhanula | | G01R 31/31727 |
| | | | | 714/27 |
| 2012/0303996 A1* | 11/2012 | Bauernfeind | ......... | H04L 7/0012 |
| | | | | 713/503 |
| 2013/0013950 A1* | 1/2013 | Maddigan | ............ | H04L 7/02 |
| | | | | 713/400 |
| 2013/0069697 A1* | 3/2013 | Nunes | ............ | H03K 5/135 |
| | | | | 327/142 |
| 2013/0257498 A1* | 10/2013 | Ge | ............ | G11C 7/222 |
| | | | | 327/170 |
| 2014/0253201 A1 | 9/2014 | Jung et al. | | |
| 2015/0326213 A1* | 11/2015 | Huber | ............ | G06F 5/06 |
| | | | | 327/202 |

* cited by examiner

PULSE LATCH RESET TRACKING AT HIGH DIFFERENTIAL VOLTAGE

BACKGROUND

Field

The present disclosure relates generally to electronic circuits, and more particularly, to pulse latch for use with memory and other devices.

Background

An integrated circuit (IC) may have more than one group of components, where each group of components is designed to operate at a different voltage level. For example, a first group of components may be designed to operate at a first voltage level, and a second group of components may be designed to operate at a second, different voltage level. Integrated circuits that are designed with groups of components operating at more than one voltage level are said to have multiple power domains, where each power domain is associated with a particular voltage level. In operation, a particular power domain may be selectively powered up or down by controlling power to the network of circuit wirings connecting the group of components in that power domain.

Because memory circuits and chip logic circuits have different voltage requirements, memory circuits and chip logic circuits usually reside in different power domains. For example, memory circuits may reside in a power domain called memory domain and chip logic circuits may reside in a power domain called chip domain. There may be a large difference between the voltage level of the memory domain and the voltage level of the chip domain.

A memory device is commonly used in many electronics devices, such as computers, wireless communication devices, personal digital assistants (PDAs), and other electronic devices. A memory device typically includes a large number of memory cells for storing data. A read circuit may be used to read data from the memory cells and a write circuit may be used to write data to the memory cells. The read circuit may include a pulse latch circuit for generating a read clock. Similarly, the write circuit may include a pulse latch circuit for generating a write clock. The read and write clocks are used to access the memory cells. The ability to properly access these memory cells often depends on the stability of the pulse latches used to generate the read and write clocks.

SUMMARY

In an aspect of the disclosure, a method and an apparatus for generating an internal memory clock are provided. The apparatus includes a pulse generator configured to receive a first clock signal in a first power domain and initiate a second clock signal in a second power domain in response to the first clock signal. The apparatus includes a tracking circuit configured to generate a reset signal based on a voltage level of the first power domain. The reset signal may be configured to reset the pulse generator in the first power domain.

In another aspect of the disclosure, a method and an apparatus for generating an internal memory clock are provided. The apparatus receives a first clock signal in a first power domain. The apparatus triggers a second clock signal in a second power domain in response to the first clock signal. The apparatus generates a reset signal based on a voltage level of the first power domain. The apparatus resets in the first power domain using the reset signal.

DETAILED DESCRIPTION

Figure 1:
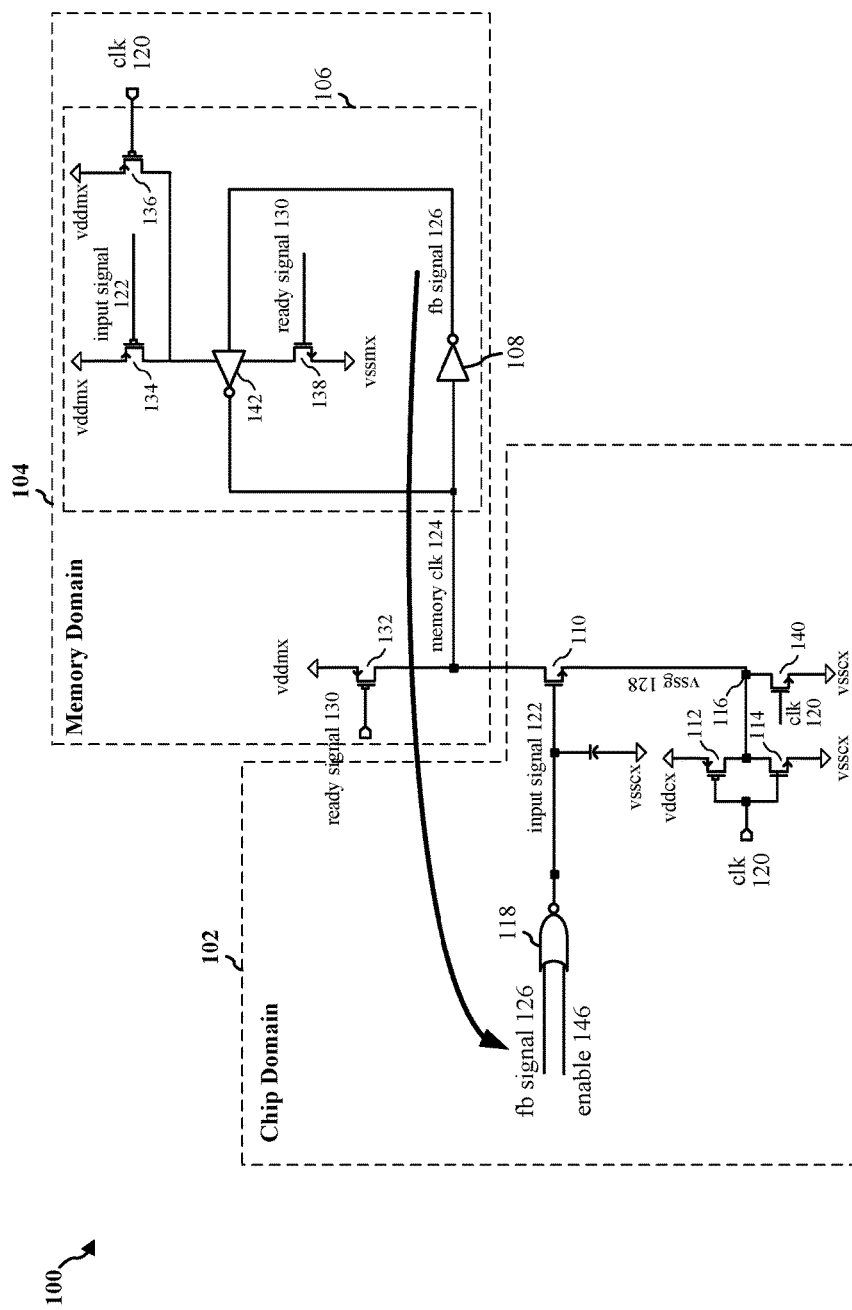
FIG. 1 is a schematic representation of one example of a pulse latch circuit.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of pulse latch will now be presented with reference to various apparatus and methods. These apparatus and methods will be described in the following detailed description and illustrated in the accompanying drawings by various blocks, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

Although particular aspects will be described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different circuits, technologies, systems, networks, and methods, some of which are illustrated by way of example in the drawings and in the following description. The detailed description and drawings are merely illustrative of the disclosure rather than limiting, the scope of the disclosure being defined by the appended claims and equivalents thereof.

The various circuits described throughout this disclosure may be implemented in various forms of hardware. By way of example, any of these circuits, either alone or in combination, may be implemented as an integrated circuit, or as part of an integrated circuit. The integrated circuit may be an end product, such as a microprocessor, a digital signal processor (DSP), an application specific integrated circuit (ASIC), programmable logic, memory, or any other suitable integrated circuit. Alternatively, the integrated circuit may be integrated with other chips, discrete circuit elements, and/or other components as part of either an intermediate product, such as a motherboard, or an end product. The end product can be any suitable product that includes integrated circuits, including by way of example, a cellular phone, a personal digital assistant (PDA), a laptop computer, a desktop computer (PC), a computer peripheral device, a multimedia device, a video device, an audio device, a global positioning system (GPS), a wireless sensor, or any other suitable device.

Various aspects of pulse latch circuits for use in read and write circuits in memory devices will now be presented. However, as those skilled in the art will recognize, these aspects may be extended to various other circuits used in memory and other devices. Examples of memory devices include random access memory (RAM), static RAM (SRAM), dynamic RAM (DRAM), synchronous dynamic RAM (SDRAM); double data rate RAM (DDRAM), read only memory (ROM), programmable ROM (PROM), erasable PROM (EPROM), electrically erasable PROM (EEPROM), a general register on a processor, flash memory, or any other suitable memory.

One aspect of this disclosure relates to memory internal clock reset tracking for improved noise margin and signal integrity. Pulse latch circuits are used for generating edge triggered internal clock for memory operation. Pulse latch circuits remove the dependency of external clock once the operation is initiated, as well as level shifting from voltage of the chip domain to the voltage of memory domain. The noise margin and signal integrity of pulse latch output are paramount for successful memory functionality.

FIG. 1 is a schematic representation of one example of a pulse latch circuit 100. Components of the pulse latch circuit 100 may reside in two power domains: the chip domain 102 (e.g., VDDCX) and the memory domain 104 (e.g., VDDMX). The negative power supply pins of the chip domain 102 and the memory domain 104 may be VSSCX and VSSMX, respectively. In one configuration, VSSCX and VSSMX may be GND. In one configuration, the voltage level of the chip domain 102 may be much lower than the voltage level of the memory domain 104. For example, the voltage level of the chip domain 102 may be 0.444V, while the voltage level of the memory domain 104 may be 1.119V. Therefore, there may be a 0.675V difference between the voltage level of the chip domain 102 and the voltage level of the memory domain 104. The pulse latch circuit 100 generates a memory clock 124 in the memory domain 104 based on a clock signal 120 in the chip domain 102. The pulse latch circuit 100 may act as a level shifter by transferring a clock signal in the chip domain 102 to the memory domain 104.

In the chip domain 102, the pulse latch circuit 100 includes n-type metal-oxide-semiconductor (nMOS) (also referenced to as n-channel) transistor 110. A pulse latch input signal 122 is applied to the gate of the nMOS transistor 110. The drain of the nMOS transistor 110 may produce a memory clock 124. The pulse latch circuit 100 also includes a set of transistors including p-type metal-oxide-semiconductor (pMOS) (also referenced to as p-channel) transistor 112 and nMOS transistors 114 and 140 in the chip domain 102. The nMOS transistors 114 and 140 pull down node 116 to VSSCX (e.g., GND) when a chip domain clock signal 120 goes high. The chip domain clock signal 120 is applied to the gates of transistors 112, 114, and 140. The node 116 provides VSSG 128 (e.g., GND) to the source of the nMOS transistor 110.

The pulse latch circuit 100 includes a NOR gate 118 in the chip domain 102. The first input of the NOR gate 118 may be an enable signal 146, which may be set to logic low by a circuit (not shown) after the pulse latch circuit 100 is triggered. The second input of the NOR gate 118 is provided with a feedback signal 126. The output of the NOR gate 118 is provided to the gate of the nMOS transistor 110 as the pulse latch input signal 122.

In the memory domain 104, the pulse latch circuit 100 includes a latch 106 that is configured to latch the memory clock 124. The latch 106 includes inverter 108 and tri-state inverter 142. The tri-state inverter 142 may be controlled by pMOS transistors 134 and 136, and nMOS transistor 138. In one configuration, when the ready signal 130 is high, or the input signal 122 is low, or the clock 120 is low, the tri-state inverter 142 is enabled. The inverter 108 takes the memory clock 124 as input and outputs the feedback signal 126. The feedback signal 126 is provided to the second input of the NOR gate 118 in the chip domain 102. The NOR gate 118 generates the input signal 122 based on the feedback signal 126. In one configuration, the input signal 122 serves as a reset signal for resetting the pulse latch circuit 100.

In one configuration, as soon as the clock signal 120 in the chip domain 102 goes high, the nMOS transistors 114 and 140 pull down node 116. Consequently, VSSG 128/node 116 goes low. Initially, the input signal 122 in the chip domain 102 and the memory clock 124 in the memory domain 104 are at logic high. Because the input signal 122 is applied to the gate of the nMOS transistor 110, input signal 122 at logic high allows current to flow between the source and drain of the nMOS transistor 110. Therefore, the going low of VSSG 128 discharges the memory clock 124 in the memory domain 104. Once the memory clock 124 discharges to a certain low voltage level, a high feedback signal 126 may be generated based on the discharged memory clock 124. The high feedback signal 126 is provided to the second input of the NOR gate 118. The NOR gate 118 outputs a low input signal 122 based on the high feedback signal 126. The low input signal 122 turns off the nMOS transistor 110. Subsequently, the memory clock 124 starts charging when the ready signal 130 goes low. The ready signal 130 is applied to the gate of pMOS transistor 132 and nMOS transistor 138. As a result, the output of the tri-state inverter 142 is in the high impedance state to allow the new value of the memory clock 124 to pass through the inverter 108. Once the memory clock 124 charges to a certain high voltage level, a low feedback signal 126 may be generated based on the charged memory clock 124. The low feedback signal 126 is provided to the second input of the NOR gate 118. The NOR gate 118 outputs a high input signal 122 based on the low feedback signal 126. The high input signal 122 turns on the nMOS transistor 110. Subsequently, the memory clock 124 starts to be discharged by VSSG 128 again and a new clock cycle begins.

Therefore, the feedback signal 126 enables the memory clock 124 to operate independent of the external clock 120. Once the memory clock 124 is initially discharged when the external clock 120 goes high, it can trigger operations at the memory domain 104 without further involvement of the external clock 120. The new value of the memory clock 124 may be latched by the latch 106.

Figure 2:
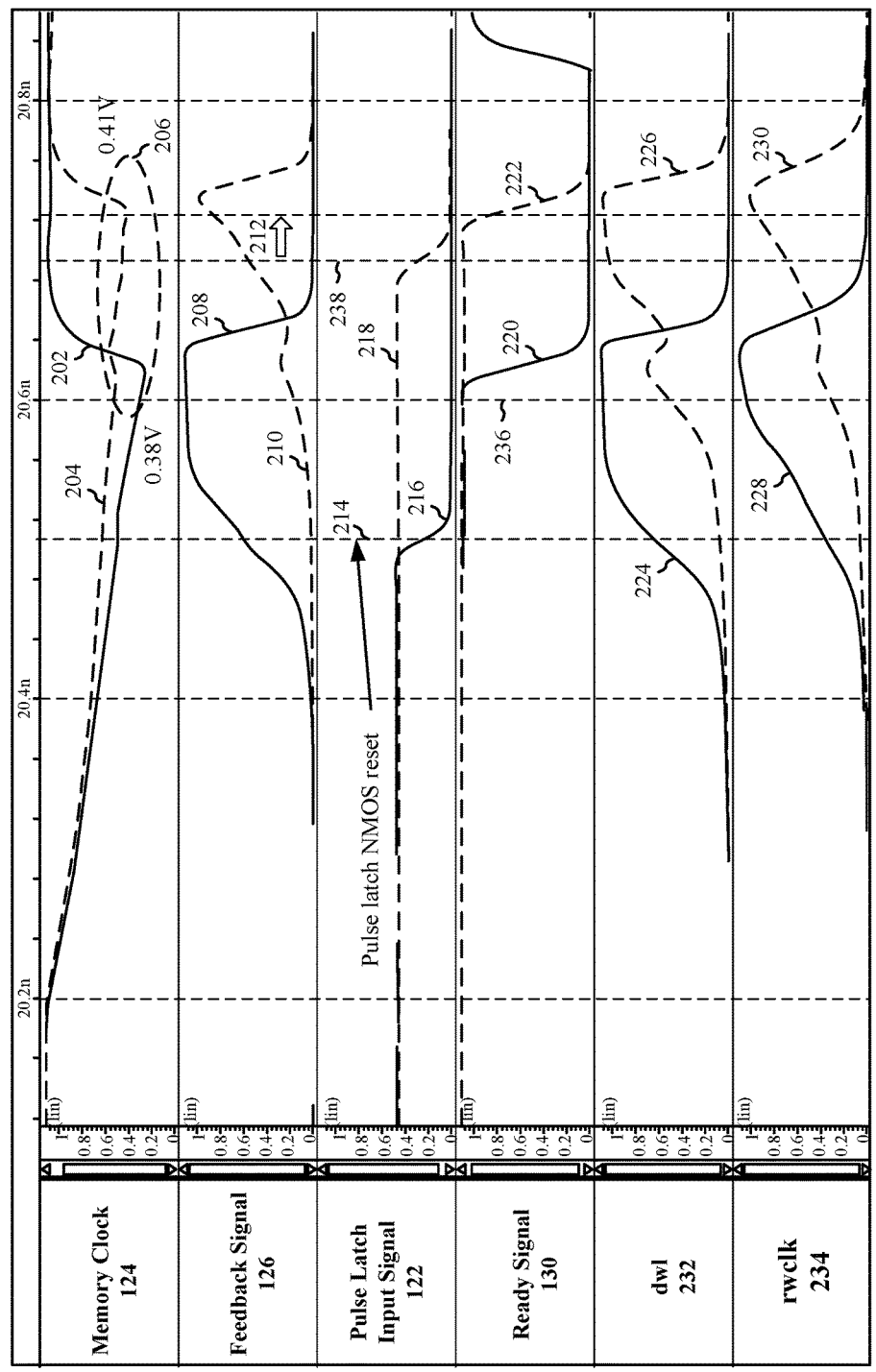
FIG. 2 is a diagram illustrating an example of waveforms of the signals in the pulse latch circuit described above with reference to FIG. 1.

FIG. 2 is a diagram illustrating an example of waveforms of the signals in the pulse latch circuit 100 described above with reference to FIG. 1. As shown in the example, waveforms for memory clock 124, feedback signal 126, pulse latch input signal 122, and ready signal 130 are illustrated. In addition, waveforms for two signals (dwl signal 232 and rwclk signal 234) derived from the memory clock 124 are also illustrated. For each signal, a waveform simulating a regular condition is illustrated with a solid line, and a waveform simulating the worst case scenario is illustrated with a dotted line. For example, for memory clock 124, waveform 202 simulates the regular condition, and waveform 204 simulates the worst case scenario. In one configuration, the worst case scenario represents a situation where the voltage level difference between the memory domain 104 and the chip domain 102 is the largest.

Under the regular condition, the memory clock 124 gradually discharges along waveform 202 before time 214. The feedback signal 126 goes high along waveform 208 correspondingly. Because the feedback signal 126 is generated at the memory domain 104, at time 214, the voltage of the feedback signal 126 can rise to a level that is high enough to be considered as logic high in the chip domain 102. Since the feedback signal 126 may be considered logic high at time 214, the pulse latch input signal 122 changes to logic low at time 214, as shown in waveform 216. When the pulse latch input signal 122 becomes logic low, it turns off the nMOS transistor 110 earlier than expected. As a result, the waveform 202 for the memory clock 124 may stop discharging after time 214. Thus, the waveform 202 does not go completely low before it goes high again. For example, the waveform 202 may stop going low at around 0.38V-0.41V, as shown in area 206. The ready signal 130 resets the output of the pulse latch circuit 100 at time 236, as shown in waveform 220. Consequently, the memory clock 124 starts to go high after time 236. Because waveform 202 of the memory clock 124 does not go completely low, the latch 106 may not have enough time to hold the new value of memory clock 124.

Similarly, under the worst case scenario, the memory clock 124 gradually discharges along waveform 204 before time 238. The feedback signal 126 goes high along waveform 210 correspondingly. Because the feedback signal 126 is generated at the memory domain 104, at time 238, the voltage of the feedback signal 126 can rises to a level that is high enough to be considered as logic high in the chip domain 102. Since the feedback signal 126 is considered logic high at time 238, the pulse latch input signal 122 changes to logic low at time 238, as shown in waveform 218. When the pulse latch input signal 122 becomes logic low, it turns off the nMOS transistor 110 earlier than expected. As a result, the waveform 204 for the memory clock 124 may stop discharging after time 238. Thus, the waveform 204 does not go completely low before it goes high again. For example, the waveform 204 may stops going low at around 0.38V-0.41V, as shown in area 206. The ready signal 130 resets the output of the pulse latch circuit 100 within the window 212, as shown in waveform 222. However, because waveform 204 of the memory clock 124 does not go completely low, the latch 106 may not have enough time to hold the new value of memory clock 124.

Due to the large voltage level difference between the chip domain 102 and the memory domain 104, the slope of waveforms 202 and 204 for the memory clock 124 is poor. The input signal 122 of the pulse latch circuit 100 is reset much earlier than the memory clock 124 reaches full level since the reset path (e.g., the feedback signal 126) is independent of the chip domain 102. As a result, the pulse latch circuit 100 may be susceptible to variations and may have poor noise margin at low chip domain voltages (e.g., in window 212). Moreover, memory clock high pulse violation can make margin degradation severe, especially at high clock slews, since the memory clock 124 and the feedback signal 126 are heavily loaded. Furthermore, hold time variation becomes non-linear in the pulse latch circuit 100.

The dwl signal 232 may be generated, based on the memory clock 124, for memory timing. The rwclk signal 234 may be generated, based on the memory clock 124, for triggering write line of the memory device. Waveforms 224 and 226 for the dwl signal 232 and waveforms 228 and 230 for the rwclk signal 234 show bad shapes that may introduce errors during the operation of the memory device.

Figure 3:
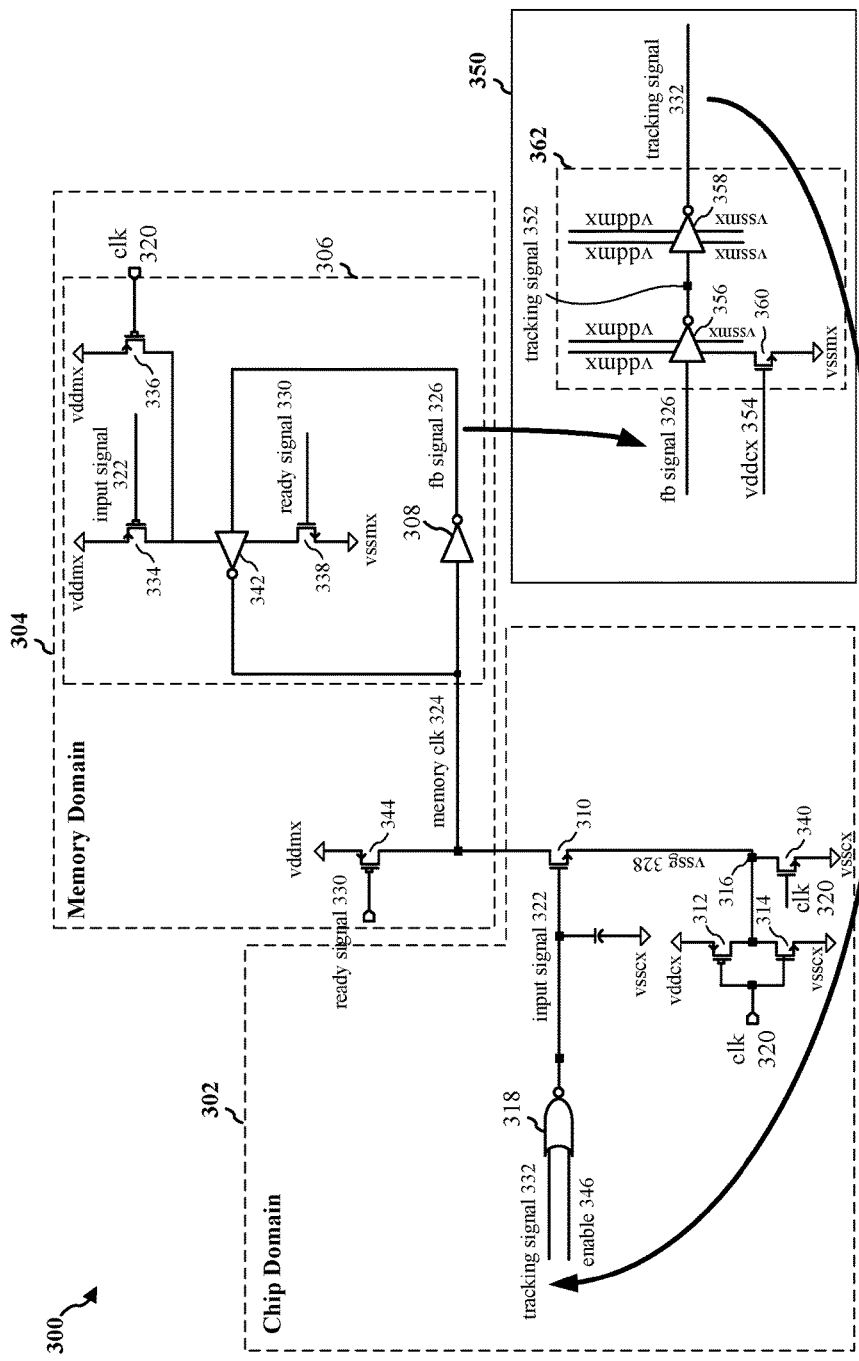
FIG. 3 is a schematic representation of one example of a pulse latch circuit.

FIG. 3 is a schematic representation of one example of a pulse latch circuit 300. In one configuration, a component of the pulse latch circuit 300 may perform similar functions to the corresponding component of pulse latch circuit 100 described above with reference to FIG. 1. Components of the pulse latch circuit 300 may reside in two power domains: the chip domain 302 (e.g., VDDCX) and the memory domain 304 (e.g., VDDMX). The negative power supply pins of the chip domain 302 and the memory domain 304 may be VSSCX and VSSMX, respectively. In one configuration, VSSCX and VSSMX may be GND. In one configuration, the voltage level of the chip domain 302 may be much lower than the voltage level of the memory domain 304. For example, the voltage level of the chip domain 302 may be 0.444V, while the voltage level of the memory domain 304 may be 1.119V. Therefore, there may be a 0.675V difference between the voltage level of the chip domain 302 and the voltage level of the memory domain 304. The pulse latch circuit 300 generates a memory clock 324 in the memory domain 304 based on a clock signal 320 in the chip domain 302. The memory clock 324 drives memory operations. The pulse latch circuit 300 may act as a level shifter by transferring a clock signal in the chip domain 302 to the memory domain 304.

In the chip domain 302, the pulse latch circuit 300 includes nMOS transistor 310. In one configuration, the nMOS transistor 310 may be part of a pulse generator that is configured to receive the clock signal 320 in the chip domain 302 and initiate the memory clock 324 in the memory domain 304 in response to the clock signal 320. A pulse latch input signal 322 is applied to the gate of the nMOS transistor 310. The drain of the nMOS transistor 310 may produce a memory clock 324. The pulse latch circuit 300 also includes a set of transistors including pMOS transistor 312 and nMOS transistors 314 and 340 in the chip domain 302. The transistors 314 and 340 pull down node 316 to VSSCX (e.g., GND) when a chip domain clock signal 320 goes high. The chip domain clock signal 320 is applied to the gates of transistors 312, 314, and 340. The node 316 provides VSSG 328 (e.g., GND) to the source of the nMOS transistor 310.

The pulse latch circuit 300 includes a NOR gate 318 in the chip domain 302. The first input of the NOR gate 318 may be an enable signal 346. The enable signal 346 may be set to logic low by a circuit (not shown) after the pulse latch circuit 300 is triggered. The second input of the NOR gate 318 is provided with a tracking signal 332. The output of the NOR gate 318 is provided to the gate of the nMOS transistor 310 as the pulse latch input signal 322.

In the memory domain 304, the pulse latch circuit 300 includes a latch 306 that is configured to latch the memory clock 324. The latch 306 includes inverter 308 and tri-state inverter 342. The tri-state inverter 342 may be controlled by pMOS transistors 334 and 336, and nMOS transistor 338. In one configuration, when the ready signal 330 is high, or the input signal 322 is low, or the clock 320 is low, the tri-state inverter 342 is enabled. The inverter 308 takes the memory clock 324 as input and outputs a feedback signal 326. Instead of providing the feedback signal directly to an input of the NOR gate 318, the feedback signal 326 is provided to a chip domain tracking circuit 350.

The chip domain tracking circuit 350 includes two inverters 356 and 358 that are connected in series to operate as a buffer 362. The feedback signal 326 is provided as the input to the inverter 356, which outputs tracking signal 352. The inverter 358 takes tracking signal 352 as input and outputs tracking signal 332. The inverter 356 is controlled by voltage 354 of the chip domain 302 (e.g., VDDCX). Specifically, voltage 354 of the chip domain 302 is applied to the gate of nMOS transistor 360, which discharges the inverter 356 when turned on. When voltage 354 of the chip domain 302 is relatively low compared to the voltage level of the memory domain 304, nMOS transistor 360 is weakly turned on and discharges the inverter 356 slowly. Consequently, the feedback signal 326 propagates through the inverter 356 slowly to generate the tracking signal 352. The lower the voltage 354, the slower for the feedback signal 326 to propagate through the inverter 356. Even though the inverter 356 is controlled by voltage 354 of the chip domain 302 in this example, one of ordinary skill in the art would recognize that, instead of controlling the inverter 356, voltage 354 of the chip domain 302 can be used to control the inverter 358.

The tracking signal 332 is provided to the second input of the NOR gate 318 in the chip domain 302. The NOR gate 318 generates the input signal 322 based on the tracking signal 332. In one configuration, the input signal 322 serves as a reset signal for resetting the pulse latch circuit 300.

In one configuration, as soon as the clock signal 320 in the chip domain 302 goes high, the transistors 314 and 340 pull down node 316. Consequently, VSSG 328 goes low. Initially, the input signal 322 in the chip domain 302 and the memory clock 324 in the memory domain 304 are at logic high. Because the input signal 322 is applied to the gate of the nMOS transistor 310, input signal 322 at logic high allows current to flow between the source and drain of the nMOS transistor 310. Therefore, the going low of VSSG 328 discharges the memory clock 324 in the memory domain 304. Once the memory clock 324 discharges to a certain low voltage level, a high feedback signal 326 may be generated based on the discharged memory clock 324. The high feedback signal 326 propagates through the chip domain tracking circuit 350 based on the voltage 354 of the chip domain 302. The lower the voltage 354, the slower for the high feedback signal 326 to propagate through the chip domain tracking circuit 350. The chip domain tracking circuit 350 outputs a high tracking signal 332 based on the high feedback signal 326.

The high tracking signal 332 is provided to the second input of the NOR gate 318. The NOR gate 318 outputs a low input signal 322 based on the high tracking signal 332. The low input signal 322 turns off the nMOS transistor 310. Subsequently, the memory clock 324 starts charging when the ready signal 330 goes low. The ready signal 330 is applied to the gate of pMOS transistor 344 and nMOS transistor 338. As a result, the output of the tri-state inverter 342 is in the high impedance state to allow the new value of the memory clock 324 to pass through the inverter 308. Once the memory clock 324 charges to a certain high voltage level, a low feedback signal 326 may be generated based on the charged memory clock 324. The low feedback signal 326 propagates through the chip domain tracking circuit 350 based on the voltage 354 of the chip domain 302. The lower the voltage 354, the slower for the low feedback signal 326 to propagate through the chip domain tracking circuit 350. The chip domain tracking circuit 350 outputs a low tracking signal 332 based on the low feedback signal 326.

The low tracking signal 332 is provided to the second input of the NOR gate 318. The NOR gate 318 outputs a high input signal 322 based on the low tracking signal 332. The high input signal 322 turns on the nMOS transistor 310. Subsequently, the memory clock 324 starts to be discharged by VSSG 328 again and a new clock cycle begins.

Therefore, the tracking signal 332 enables the memory clock 324 to operate independent of the external clock 320. Once the memory clock 324 is initially discharged when the external clock 320 goes high, it can trigger operations at the memory domain 304 without further involvement of the external clock 320. In addition, the chip domain tracking circuit 350 delays the propagation of the feedback signal 326 based on the voltage level of the chip domain 302. The new value of the memory clock 324 may be latched by the latch 306.

Figure 4:
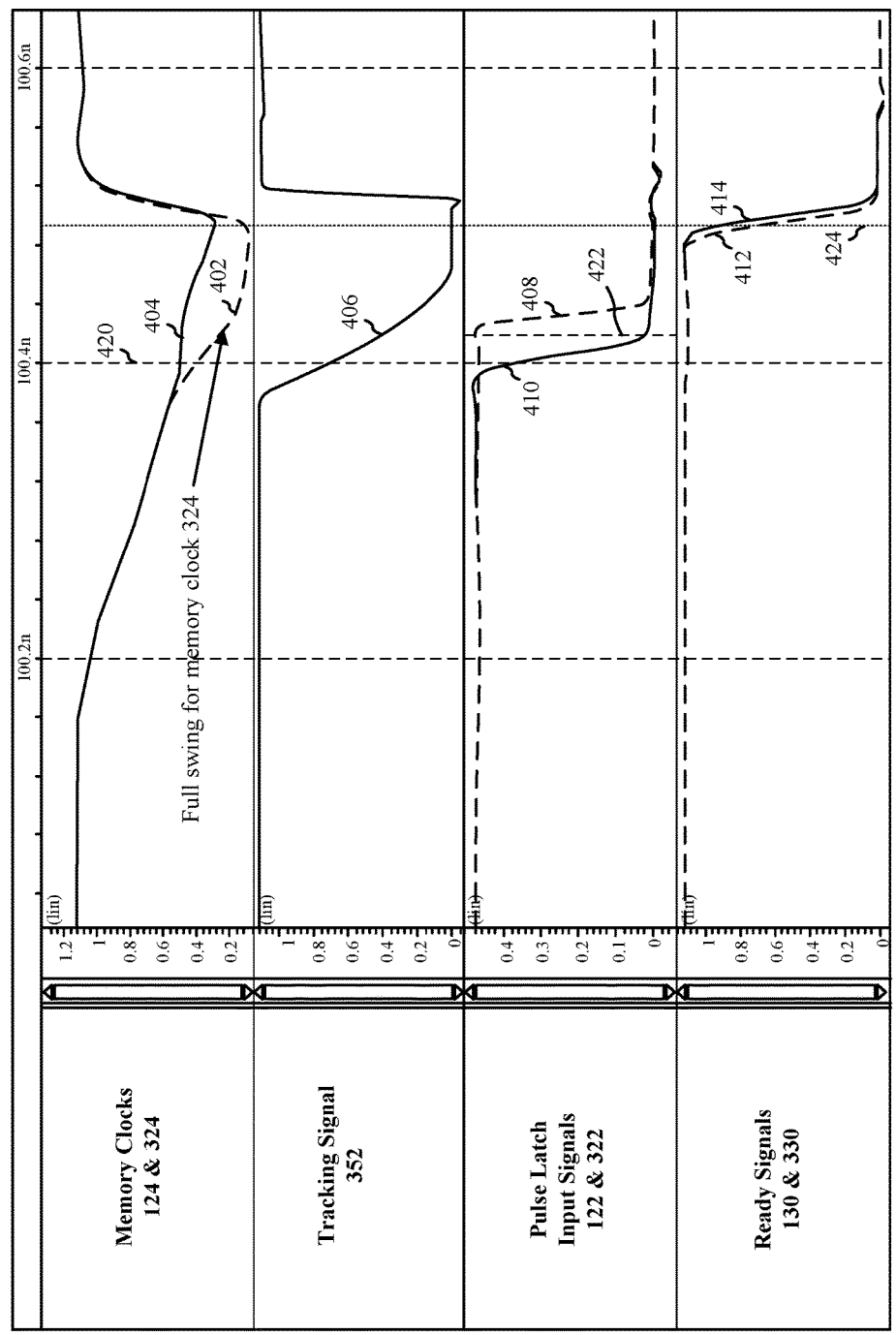
FIG. 4 is a diagram illustrating an example of a comparison of waveforms of the signals in the pulse latch circuit described above with reference to FIG. 3 and waveforms of the signals in the pulse latch circuit described above with reference to FIG. 1.

FIG. 4 is a diagram illustrating an example of a comparison of waveforms of the signals in the pulse latch circuit 300 described above with reference to FIG. 3 and waveforms of the signals in the pulse latch circuit 100 described above with reference to FIG. 1. As shown in the example, waveform 404 and 402 simulate the memory clocks 124 and 324, respectively. Waveform 406 simulates the tracking signal 352. Waveforms 410 and 408 simulate the pulse latch input signals 122 and 322, respectively. Waveforms 414 and 412 simulate the ready signals 130 and 330, respectively. The waveforms of the signals in the pulse latch circuit 100 (e.g., 404, 410, and 414) behave similarly as the waveforms described above with reference to FIG. 2.

The memory clock 324 gradually discharges along waveform 402 before time 420. Instead of changing to logic low at time 420, as shown in waveform 410 of the pulse latch input signal 122, the pulse latch input signal 322 delays the transition to logic low to time 422, as shown in waveform 408. This delay of transition is caused by the chip domain tracking circuit 350, which slows down the propagation of the feedback signal 326. When the pulse latch input signal 322 becomes logic low, it turns off the nMOS transistor 310. Because of the delay of transition to logic low for the pulse latch input signal 322, the waveform 402 for the memory clock 324 has a full swing to logic low.

The tracking signal 352 also shows a full swing to logic low, as illustrated in waveform 406. The high pulse width of the pulse latch input signal 322 increases proportional to the voltage level of the chip domain 302, as shown in waveform 408. In one configuration, the lower the voltage level of the chip domain 302, the wider the high pulse width of the pulse latch input signal 322. The ready signal 330 resets the output of the pulse latch circuit 300 at time 424, as shown in waveform 412. However, because the waveform 402 of memory clock 324 has a full swing to logic low, the latch 306 may maintain a healthy margin to hold the new value of memory clock 324.

Therefore, by adding the chip domain tracking circuit 350 for resetting the pulse latch circuit 300, improved pulse latch response across all chip domain 302 and memory domain 304 corner ranges, including cases where voltage level of the memory domain 304 is much higher than voltage level of the chip domain 302. There is no failure of the pulse latch circuit 300 due to the full swing of the memory clock 324, as illustrated in waveform 402. There is negligible area overhead because the chip domain tracking circuit 350 has a compact design that can be easily accommodated. Also, because voltage of the chip domain 302 controls the nMOS transistor 360, there is no well spacing related area loss. The low pulse width requirement of the memory clock 324 may be linearly increased based on the voltage level of the chip domain 302.

Figure 5:
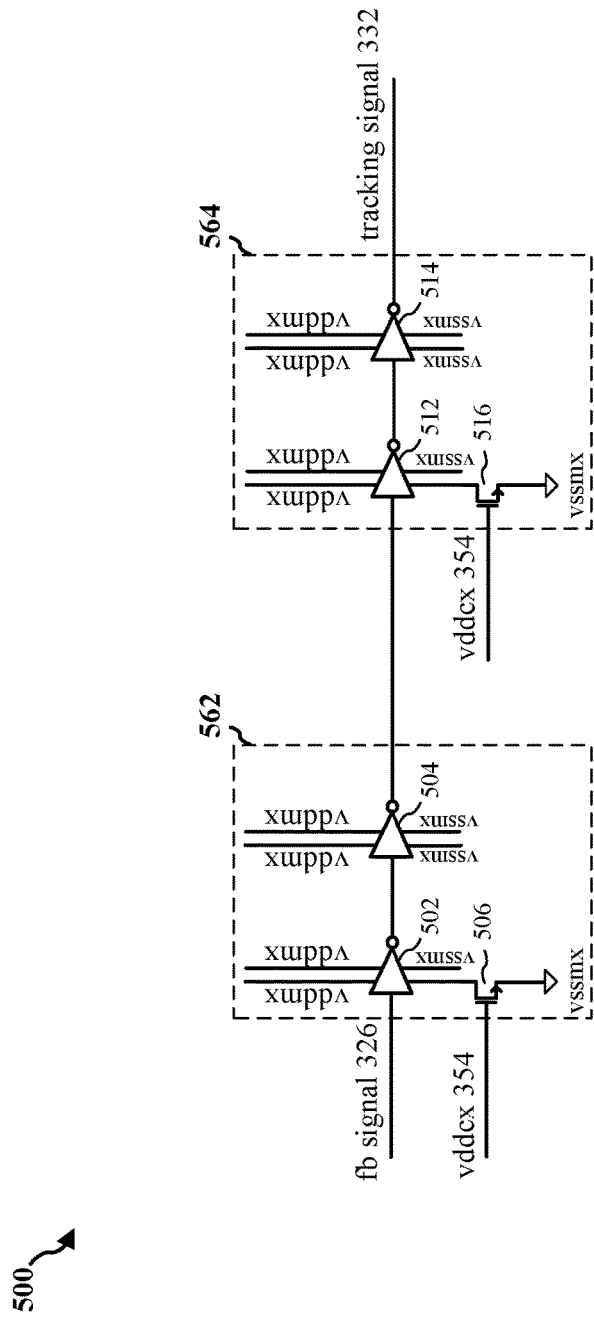
FIG. 5 is a schematic representation of an example of a chip domain tracking circuit.

FIG. 5 is a schematic representation of an example of a chip domain tracking circuit 500. In one configuration, the chip domain tracking circuit 500 may replace the chip domain tracking circuit 350 described above with reference to FIG. 3. The chip domain tracking circuit 500 includes four inverters 502, 504, 512, and 514 that are connected in series. The inverters 502 and 504 operate as a buffer 562. The inverters 512 and 514 operate as a buffer 564. The feedback signal 326 is provided as the input of the inverter 502. The feedback signal 326 propagates through the inverters 502, 504, 512, and 514, and is outputted by the inverter 514 as the tracking signal 332.

The inverters 502 and 512 are controlled by voltage 354 of the chip domain 302 (e.g., VDDCX). Specifically, voltage 354 of the chip domain 302 is applied to the gate of nMOS transistor 506, which discharges the inverter 502 when turned on. When voltage 354 of the chip domain 302 is relatively low compared to the voltage level of the memory domain 304, nMOS transistor 506 is weakly turned on and discharges the inverter 502 slowly. Consequently, the feedback signal 326 propagates through the inverter 502 slowly. Similarly, voltage 354 of the chip domain 302 is applied to the gate of nMOS transistor 516, which discharges the inverter 512 when turned on. When voltage 354 of the chip domain 302 is relatively low compared to the voltage level of the memory domain 304, nMOS transistor 516 is weakly turned on and discharges the inverter 512 slowly. Consequently, signal propagates through the inverter 512 slowly. The lower the voltage 354, the slower for signal to propagate through the inverters 502 and 512.

Even though the inverters 502 and 512 are controlled by voltage 354 of the chip domain 302 in this example, one of ordinary skill in the art would recognize that, instead of controlling the inverters 502 and 512, voltage 354 of the chip domain 302 can be used to control the inverters 504 and 514 to achieve the same result. One of ordinary skill in the art would also recognize that, instead of using one buffer (e.g., 362) or two buffers (e.g., 562 and 564) to form this chip domain tracking circuit, three or more number of buffers may be used to form the chip domain tracking circuit.

Figure 6:
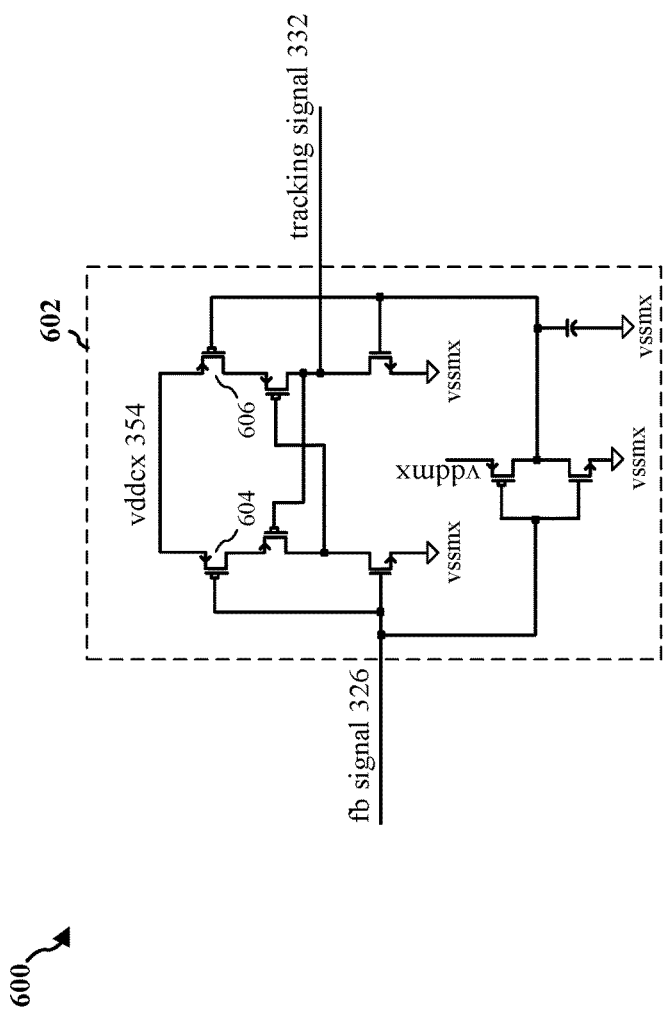
FIG. 6 is a schematic representation of another example of a chip domain tracking circuit.

FIG. 6 is a schematic representation of another example of a chip domain tracking circuit 600. In one configuration, the chip domain tracking circuit 600 may replace the chip domain tracking circuit 350 described above with reference to FIG. 3. The chip domain tracking circuit 600 includes a level shifter 602. The feedback signal 326 is provided as the input of the level shifter 602. The feedback signal 326 propagates through the level shifter 602, and is outputted by the level shifter 602 as the tracking signal 332. The level shifter 602 slows down the propagation of the feedback signal 326.

Two pMOS transistors 604 and 606 of the level shifter 602 are controlled by voltage 354 of the chip domain 302 (e.g., VDDCX). When voltage 354 of the chip domain 302 is relatively low compared to the voltage level of the memory domain 304, the feedback signal 326 propagates through the level shifter 602 slowly. The lower the voltage 354, the slower for signal to propagate through the level shifter 602.

In one configuration, a pulse generator may be configured to receive a first clock signal in a first power domain and initiate a second clock signal in a second power domain in response to the first clock signal. The pulse generator may include the nMOS transistor 310, the NOR gate 318, and the pMOS transistor 344 described above with reference to FIG. 3. In one configuration, a tracking circuit may be configured to generate a reset signal based on a voltage level of the first power domain. The reset signal is configured to reset the pulse generator in the first power domain. The tracking circuit may be the chip domain tracking circuit 350, 500, or 600 described above with reference to FIG. 3, 5, or 6, respectively. In one configuration, a latch may be configured to receive the second clock signal in the second power domain. The latch may be the latch 306 described above with reference to FIG. 3.

Figure 7:
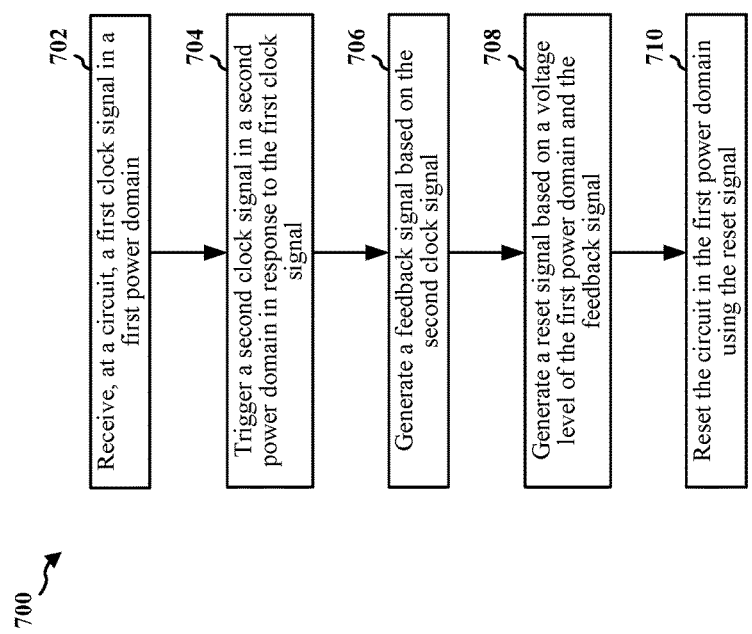
FIG. 7 is a flowchart of a method of generating an internal memory clock.

FIG. 7 is a flowchart 700 of a method of generating an internal memory clock. The method may be performed by a pulse latch circuit (e.g., the pulse latch circuit 300). At 702, the pulse latch circuit receives a first clock signal in a first power domain. In one configuration, the first power domain may be a chip domain (e.g., the chip domain 302). In one configuration, the first clock signal may be the chip domain clock signal 320 described above with reference to FIG. 3. In such configuration, the first clock signal may be received by the transistors 312 and 314 described above with reference to FIG. 3.

At 704, the pulse latch circuit triggers a second clock signal in a second power domain in response to the first clock signal. In one configuration, the second power domain may be a memory domain (e.g., the memory domain 304). In one configuration, the second clock signal may be the memory clock 324 described above with reference to FIG. 3. In one configuration, the first clock signal (e.g., clock signal 320) is applied to gates of a set of transistors (e.g., transistors 312, 314, and 340). When the first clock signal goes high, the transistors 314 and 340 are turned on to pull down the source of nMOS transistor (e.g., the nMOS transistor 310). Consequently, the second clock signal (e.g., the memory clock 324) is discharged and triggered.

At 706, the pulse latch circuit generates a feedback signal based on the second clock signal. In one configuration, the feedback signal may be the feedback signal 326 described above with reference to FIG. 3. In such configuration, an inverter (e.g., the inverter 308) converts the second clock signal (e.g., the memory clock 324) to the feedback signal (e.g., 326).

At 708, the pulse latch circuit generates a reset signal based on a voltage level of the first power domain and the feedback signal. In one configuration, the reset signal may be the pulse latch input signal 322 described above with reference to FIG. 3. In one configuration, a tracking signal (e.g., the tracking signal 332) is generated based on the voltage level of the first power domain (e.g., voltage 354 of the chip domain 302) and the feedback signal (e.g., the feedback signal 326), and the reset signal is generated based on the tracking signal. In one configuration, a chip domain tracking circuit (e.g., 352, 500, or 600) generates the tracking signal (e.g., the tracking signal 332) based on the voltage level of the first power domain (e.g., voltage 354 of the chip domain 302) and the feedback signal (e.g., the feedback signal 326).

In one configuration, the voltage level of the first power domain may be used to control a propagation of the feedback signal through a buffer to generate the reset signal. In one configuration, the voltage level of the first power domain may be used to control a propagation of the feedback signal through two or more buffers to generate the reset signal. In one configuration, the voltage level of the first power domain may be used to control a propagation of the feedback signal through a level shifter to generate the reset signal. In one configuration, the propagation of the feedback signal is slower when the voltage level of the first power domain is lower. In one configuration, a NOR gate (e.g., the NOR gate 318) generates the reset signal (e.g., the pulse latch input signal 322) based on the tracking signal (e.g., 332).

At 710, the pulse latch circuit resets in the first power domain using the reset signal. In one configuration, the reset signal (e.g., the pulse latch input signal 322) turns nMOS transistor (e.g., the nMOS transistor 310) on or off to reset the pulse latch circuit.

Figure 8:
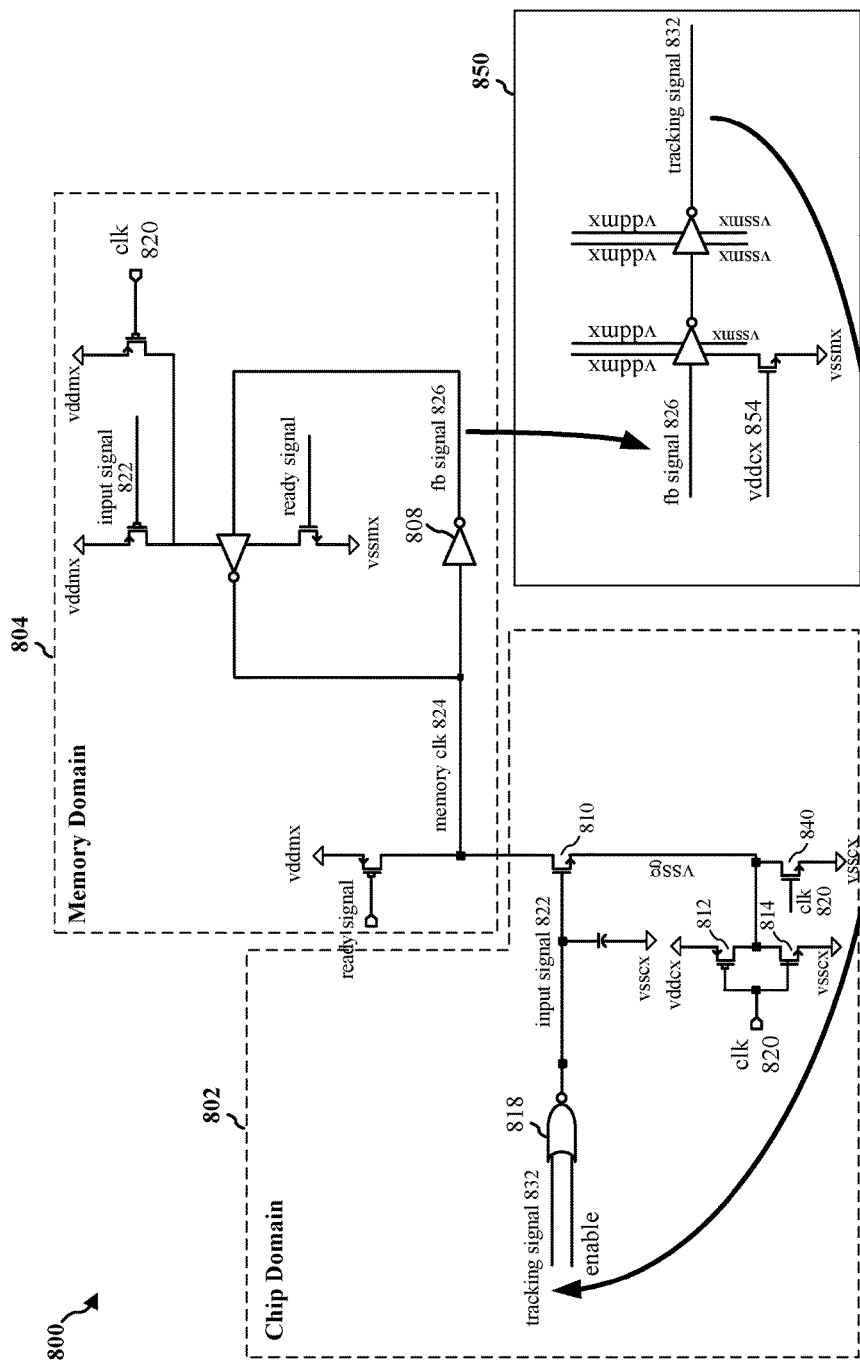
FIG. 8 is a diagram illustrating a pulse latch circuit configured to implement the method of FIG. 7.

FIG. 8 is a diagram illustrating a pulse latch circuit 800 configured to implement the method of FIG. 7. In one configuration, each component of the pulse latch circuit 800 performs similar functions to the corresponding component of pulse latch circuit 300 described above with reference to FIG. 3. Components of the pulse latch circuit 800 may reside in two power domains: the chip domain 802 (e.g., VDDCX) and the memory domain 804 (e.g., VDDMX). In one configuration, the voltage level of the chip domain 802 may be much lower than the voltage level of the memory domain 804.

In one configuration, the pulse latch circuit 800 may include means for receiving a first clock signal in a first power domain. In one configuration, the first power domain may be the chip domain 802, and the first clock signal may be the chip domain clock signal 820. In such configuration, the means for receiving a first clock signal in a first power domain may include a set of transistors including pMOS transistor 812 and nMOS transistors 814 and 840. In one configuration, the means for receiving a first clock signal in a first power domain may perform operations described above with reference to 702 of FIG. 7.

In one configuration, the pulse latch circuit 800 may include means for triggering a second clock signal in a second power domain in response to the first clock signal. In one configuration, the second power domain may be the memory domain 804, and the second clock signal may be the memory clock 824. In such configuration, the means for triggering the second clock may include the transistors 814 and 840, as well as nMOS transistor 810. In one configuration, the means for triggering the second clock may perform operations described above with reference to 704 of FIG. 7.

In one configuration, the pulse latch circuit 800 may include means for generating a feedback signal based on the second clock signal. In one configuration, the feedback signal may be the feedback signal 826. In such configuration, the means for generating the feedback signal may include the inverter 808. In one configuration, the means for generating a feedback signal may perform operations described above with reference to 706 of FIG. 7.

In one configuration, the pulse latch circuit 800 may include means for generating a reset signal based on a voltage level of the first power domain and the feedback signal. In one configuration, the reset signal may be the pulse latch input signal 822, and the voltage level of the first power domain may be voltage 854 of the chip domain 802. In such configuration, the means for generating the reset signal may include the chip domain tracking circuit 850 and the NOR gate 818. In one configuration, instead of the chip domain tracking circuit 850, the means for generating the reset signal may include the chip domain tracking circuit 500 or 600. In one configuration, the means for generating a reset signal may perform operations described above with reference to 708 of FIG. 7.

In one configuration, the means for generating the reset signal is configured to use the voltage level of the first power domain to control a propagation of the feedback signal through a buffer to generate the reset signal. In one configuration, the means for generating the reset signal is configured to use the voltage level of the first power domain to control a propagation of the feedback signal through two or more buffers to generate the reset signal. In one configuration, the means for generating the reset signal is configured to use the voltage level of the first power domain to control a propagation of the feedback signal through a level shifter to generate the reset signal.

In one configuration, the pulse latch circuit 800 may include means for resetting the pulse latch circuit 800 in the first power domain using the reset signal. In one configuration, the reset signal may be the pulse latch input signal 822. In such configuration, the means for resetting the pulse latch circuit 800 may include the nMOS transistor 810. In one configuration, the means for resetting the pulse latch circuit 800 may perform operations described above with reference to 710 of FIG. 7.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. An apparatus, comprising:
 a pulse generator configured to receive a first clock signal in a first power domain and initiate a second clock signal in a second power domain in response to the first clock signal, wherein a feedback signal is generated based on the second clock signal; and
 a tracking circuit configured to generate a reset signal based on the feedback signal and a voltage level of the first power domain, wherein the reset signal is configured to reset the pulse generator in the first power domain.

2. The apparatus of claim 1, further comprising a latch configured to receive the second clock signal in the second power domain.

3. The apparatus of claim 1, wherein the first power domain provides a first voltage for logic operations and the second power domain provides a second voltage for memory operations.

4. The apparatus of claim 3, wherein the second clock signal drives the memory operations.

5. The apparatus of claim 1, wherein the tracking circuit comprises a buffer that is controlled by the voltage level of the first power domain.

6. The apparatus of claim 5, wherein propagation of the feedback signal through the buffer is slower when the voltage level of the first power domain is lower.

7. The apparatus of claim 1, wherein the tracking circuit comprises two or more buffers that are controlled by the voltage level of the first power domain.

8. The apparatus of claim 7, wherein propagation of the feedback signal through the two or more buffers is slower when the voltage level of the first power domain is lower.

9. The apparatus of claim 1, wherein the tracking circuit comprises a level shifter that is at least partially controlled by the voltage level of the first power domain.

10. The apparatus of claim 9, wherein propagation of the feedback signal through the level shifter is slower when the voltage level of the first power domain is lower.

11. The apparatus of claim 1, wherein the pulse generator comprises an nMOS transistor that is configured to output the second clock signal and to be reset by the reset signal.

12. A method comprising:
 receiving, at a circuit, a first clock signal in a first power domain;
 triggering a second clock signal in a second power domain in response to the first clock signal;
 generating a feedback signal based on the second clock signal;
 generating a reset signal based on the feedback signal and a voltage level of the first power domain; and
 resetting the circuit in the first power domain using the reset signal.

13. The method of claim 12, wherein the first power domain provides a first voltage for logic operations and the second power domain provides a second voltage for memory operations.

14. The method of claim 13, wherein the second clock signal drives the memory operations.

15. The method of claim 12, wherein the generating the reset signal comprises using the voltage level of the first power domain to control a propagation of the feedback signal through a buffer to generate the reset signal.

16. The method of claim 15, wherein the propagation of the feedback signal is slower when the voltage level of the first power domain is lower.

17. The method of claim 12, wherein the generating the reset signal comprises using the voltage level of the first power domain to control a propagation of the feedback signal through two or more buffers to generate the reset signal.

18. The method of claim 17, wherein the propagation of the feedback signal is slower when the voltage level of the first power domain is lower.

19. The method of claim 12, wherein the generating the reset signal comprises using the voltage level of the first power domain to control a propagation of the feedback signal through a level shifter to generate the reset signal.

20. The method of claim 19, wherein the propagation of the feedback signal is slower when the voltage level of the first power domain is lower.

21. An apparatus, comprising:
 means for receiving, at a circuit, a first clock signal in a first power domain;
 means for triggering a second clock signal in a second power domain in response to the first clock signal;
 means for generating a feedback signal based on the second clock signal;
 means for generating a reset signal based on the feedback signal and a voltage level of the first power domain; and
 means for resetting the circuit in the first power domain using the reset signal.

22. The apparatus of claim 21, wherein the first power domain provides a first voltage for logic operations and the second power domain provides a second voltage for memory operations.

23. The apparatus of claim 22, wherein the second clock signal drives the memory operations.

24. The apparatus of claim 21, wherein the means for generating the reset signal is configured to use the voltage level of the first power domain to control a propagation of the feedback signal through a buffer to generate the reset signal.

25. The apparatus of claim 24, wherein the propagation of the feedback signal is slower when the voltage level of the first power domain is lower.

26. The apparatus of claim 21, wherein the means for generating the reset signal is configured to use the voltage level of the first power domain to control a propagation of the feedback signal through a level shifter to generate the reset signal.

27. The apparatus of claim 26, wherein the propagation of the feedback signal is slower when the voltage level of the first power domain is lower.

* * * * *